(12) United States Patent
Dotsikas

(10) Patent No.: US 7,241,701 B2
(45) Date of Patent: Jul. 10, 2007

(54) METHOD AND FURNACE FOR THE VAPOR PHASE DEPOSITION OF COMPONENTS ONTO SEMICONDUCTOR SUBSTRATES WITH A VARIABLE MAIN FLOW DIRECTION OF THE PROCESS GAS

(75) Inventor: Ioannis Dotsikas, Dresden (DE)

(73) Assignee: Infineon Technologies AG, Munich (DE)

( * ) Notice: Subject to any disclaimer, the term of this patent is extended or adjusted under 35 U.S.C. 154(b) by 197 days.

(21) Appl. No.: 10/675,049

(22) Filed: Sep. 30, 2003

(65) Prior Publication Data
US 2004/0081754 A1  Apr. 29, 2004

(30) Foreign Application Priority Data
Sep. 30, 2002  (DE) .................................. 102 45 553

(51) Int. Cl.
*H01L 21/31* (2006.01)
(52) U.S. Cl. ...................... 438/758; 438/714; 438/729; 118/119; 118/715
(58) Field of Classification Search .................... 438/9, 438/714, 706, 729, 758, 761, 762, 791, 22, 438/41, 46, 47; 118/119, 715, 708
See application file for complete search history.

(56) References Cited

U.S. PATENT DOCUMENTS

| 5,484,484 A * | 1/1996 | Yamaga et al. ............. 118/719 |
| 6,045,617 A | 4/2000 | Keller |
| 6,074,202 A * | 6/2000 | Yagi et al. .................... 432/11 |
| 6,184,049 B1 * | 2/2001 | Watanabe et al. ............. 438/22 |

FOREIGN PATENT DOCUMENTS

| DE | 197 43 922 C1 | 4/1999 |
| JP | 63065080 A | 3/1988 |
| JP | 02-074587 | 3/1990 |
| JP | 04-343412 | 11/1992 |

* cited by examiner

*Primary Examiner*—Dung A. Le
(74) *Attorney, Agent, or Firm*—Laurence A. Greenberg; Werner H. Stemer; Ralph E. Locher

(57) ABSTRACT

A method and a furnace are provided for the vapor phase deposition of components onto semiconductor substrates. The main flow direction of the process gases can be varied or reversed by the furnace in the course of the method. This prevents temperature and concentration inhomogeneities of the process gas within the furnace, and permits the components to be uniformly deposited onto the semiconductor substrates.

22 Claims, 3 Drawing Sheets

METHOD AND FURNACE FOR THE VAPOR PHASE DEPOSITION OF COMPONENTS ONTO SEMICONDUCTOR SUBSTRATES WITH A VARIABLE MAIN FLOW DIRECTION OF THE PROCESS GAS

BACKGROUND OF THE INVENTION

Field of the Invention

The invention relates to a method and a furnace for the vapor phase deposition of components onto semiconductor substrates.

As the computer power and the storage capacity of microchips have been continually increasing, the integration density of the electronic components, such as transistors or capacitors, has continually increased. What is referred to as Moore's law, which describes a doubling of the integration density in a period of 18 months, has thus held true for more than 30 years. In the future, the industry will attempt to increase the performance of microchips and also special components such, as e.g. video chips, in the context of Moore's law so that the electronic components must be miniaturized further.

A higher degree of integration is essentially achieved by further reducing the size of the functional elements. This concurrently leads to an increase in the operating speed of the microchip. In parallel with a rising integration density, there is also an increase in the average wafer diameter and thus in the demands on the homogeneity of the wafer surface or the layers deposited thereon. Therefore, the realization of submicron structures is at the present time one of the most important tasks for the further development of microelectronics. This gives rise to more stringent requirements made of the entire technology for fabricating microelectronic components. The individual technological steps must in part be utilized right up to their fundamental limits and new methods must be developed and introduced into industrial production.

One typical production step in the fabrication of microchips is the deposition of a layer made of a specific layer material on a wafer. The layer may be modified, if appropriate, in terms of its chemical and/or physical properties in a further production step. The deposited and, if appropriate, modified layer may subsequently be patterned by selectively removing specific sections of the layer. The layer may be produced by oxidizing or nitriding the wafer in a suitable atmosphere, for example, in order to obtain a layer made of silicon oxide or silicon nitride. Layers of these and other materials are preferably produced by methods utilizing relatively low temperatures. One example of such a method is chemical deposition from the vapor phase (chemical vapor deposition, CVD), which is usually carried out at temperatures of a few hundred degrees Celsius and within a wide pressure spectrum. In CVD methods, a substrate in a CVD process space is exposed to a flow including one or more gaseous components. The process gases are, by way of example, gaseous chemical precursor compounds of the layer material or inert carrier gases which transport the precursor compounds in solid and liquid form. The layer material is produced from the precursor compounds photolytically, thermally and/or in plasma-enhanced fashion in the CVD process space and/or above the substrate surface. The layer material is deposited on the substrate surface and forms a layer.

A high integration density as demanded particularly in the case of electronic components, such as processors and semiconductor memory devices, presupposes very small layer thicknesses and small dimensions for structures in the layer. Layer thicknesses of a few nanometers and structure dimensions of a few tens of nanometers have become customary in the meantime.

The continual miniaturization increases the demands on the layer quality determined by the defect density, roughness and homogeneity of the layer. In this case, the roughness describes a deviation of a surface of a layer from an ideally planar surface. The defect density is a measure of the number and the size of impurities or structural defects in the layer.

In this case, impurities are inclusions made of a different material than the layer material.

Structural defects may be, by way of example, voids or, in the case of crystallizing layer materials, lattice defects. Homogeneity relates to the physical and chemical uniformity of the layer. Customary methods for fabricating layers having a layer thickness of less than 1 μm on a substrate are epitaxial methods, physical vapor phase deposition (physical vapor deposition, PVD methods) and chemical vapor phase deposition (chemical vapor deposition, CVD methods).

The layers are deposited in single-wafer installations or in multiwafer installations. In multiwafer installations, a plurality of wafers are stacked one above the other at a short distance in a suitable rack. The rack, referred to as a "boat", charged with a plurality of wafers is then introduced into the process space of a furnace. The process gas containing the components to be deposited is introduced for example at the underside of the process space and then rises laterally past the wafers stacked one above the other and upward along this flow direction. This flow direction along which the principal convection material transport takes place is referred to as the main flow direction. The process gas is discharged at the top side of the process space. For this purpose, the process gas may either be passed out through a discharge line at the upper side of the furnace or it may be deflected and passed downward on the outside of the process space in order then to be pumped away at the underside of the furnace. The components contained in the process gas diffuse out of the main flow flowing laterally upward past the wafer stack into the interspace between two wafers arranged one above the other in order then to reach the wafer surface and subsequently be deposited there. The mass transfer is principally effected by diffusion, but other phenomena such as convection and thermodiffusion (Soret effect) are involved. In this case, the diffusion flow of the components out of the main flow into the space between the wafers is determined by the concentration gradient of the components in the main flow of the process gas. While the process gas rises from the bottom upward, it is thus continuously depleted of components. The consequential products thereof are deposited on the surface of the wafers, with the result that a concentration gradient is established along the main flow direction. Since the quantity of the component that is transported out of the main gas flow between the wafers depends on the set concentration gradient of the component in the main gas flow, it is possible for a larger quantity of the component to pass into the interspace between two wafers arranged one above the other in the lower region of the process space, in which the main gas flow still has a high concentration of the component, than in the upper region of the process space in which the main gas flow is largely depleted of the component. The consequence of this is that the thickness of the deposited layer is larger on wafers arranged in the lower region of the process space than in the case of wafers arranged in the upper region of the process space. Such inhomogeneities are not infrequent during nitride deposition. An analogous effect is observed when doping the silicon wafers. A high doping is effected in the lower region of the process space into which fresh dopant is continually fed, while a significantly lower doping is effected in the upper regions.

The inhomogeneities produced in this way within the process space lead to a nonuniform distribution of the material parameters of the treated semiconductor substrates within a batch and, associated with this, to different electronic and layer properties of the same component on different wafers of a batch. However, in microelectronics, in particular, extremely stringent requirements are made of the stability and the reproducibility of the fabrication steps of the electronic components.

Therefore, efforts have been made to combat the different rates of deposition of the components on wafers of a batch.

Thus, it has been proposed to provide injectors in the process space along the main flow direction. These injectors would enable dopants or other components, which are to be deposited on the wafer, to be fed into the process space. In this way, it is possible to replace the quantity of the component that has been removed from the process gas and deposited on the wafer. This means that a depletion of the component in the process gas is counteracted and the change of the concentration gradient in the process gas along the main flow direction can be suppressed. However, this solution is technically very complicated since, on the one hand, it is necessary to incorporate injectors into the process space and, on the other hand, the quantity of component fed to the process space by the injectors has to be regulated such that only the consumed quantity of the component is replaced in each case. However, injectors are highly susceptible to functional failures, such as those that occur for example, due to mechanical fracture defects.

A further possibility that is afforded is to use smaller batch sizes in order to minimize differences between the first and last wafers of a batch. However, the lower turnover per fabrication cycle means that it is necessary to expend a higher outlay with regard to costs, as a result of which the economy of the method decreases.

Furthermore, in order to balance the layer thicknesses obtained, it is possible to provide a temperature gradient within the process space. The deposition rate which is increased at a higher temperature makes it possible to counteract the depletion of the component to be deposited in the main gas flow. Temperature differences of several degrees are not infrequent, as during nitride deposition, in particular. With this method, although it is possible to achieve uniform layer thicknesses within a batch, the wafers of a batch nonetheless experience a different thermal budget. As a result, in later process steps, differences may occur in the processing of the wafers or, in the finished product, differences may occur in the electronic parameters between chips from different wafers. Very often it is not possible to compensate the differences between bottom and top, so that the only remaining action is to diminish the batch size.

In single-wafer installations, nonuniformities of temperature and concentration profiles can be compensated for by rotating the wafer about its axis. This method is offered by most manufacturers nowadays. This method is unfavorable for multiwafer installations since a rotation of the wafers or of the boat can be realized technically only with difficulty and, in multiwafer installations, the main flow direction of the process gas generally runs parallel to the normal to the wafer area and not parallel to the wafer surface, which is the case in single-wafer installations. Therefore, a concentration gradient along the main flow direction cannot be compensated for by rotating the boat about its longitudinal axis. This means that the boat rotation essentially only has a positive effect on the uniformity within a wafer, but the homogeneity of the individual wafers among one another is barely influenced.

In this case, the aspect of the uniformity of the wafers among one another becomes all the more critical, the smaller the feature sizes become. If the critical feature size is to be reduced further, the regularity with which layers are deposited within a batch must be increased further.

SUMMARY OF THE INVENTION

It is accordingly an object of the invention to provide a furnace and a method for vapor phase depositing components on a semiconductor substrate, which overcome the above-mentioned disadvantages of the prior art apparatus and methods of this general type.

In particular, it is an object of the invention to provide a method for vapor phase depositing components on a semiconductor substrate in which, even in the case of relatively large batch sizes, only slight fluctuations in the layer properties between two wafers are observed or in which fluctuations in the layer thickness of a layer deposited on a semiconductor substrate can be reduced.

With the foregoing and other objects in view there is provided, in accordance with the invention, a method for vapor phase deposition. The method includes: vapor phase depositing components contained in a process gas flowing along a main flow direction onto at least one semiconductor substrate situated in a process space; and during the step of vapor phase depositing, changing the main flow direction at least once.

In the method, the semiconductor substrates are first arranged in a customary manner in the process space. If a plurality of semiconductor substrates are situated in the process space, they are generally arranged (stacked) one above the other at a short distance. The process gases containing the components that are to be deposited on the semiconductor substrate are subsequently introduced into the process space. For this purpose, the process space includes at least one feed line that can be opened or closed off e.g. by a supply valve and through which the process gas is supplied to the process space, and also at least one discharge line through which the process gas is passed out of the process space by being pumped away, for example. A main flow direction along which the process gas flows through the process space is established between the feed line and the corresponding discharge line. As described above, a first concentration gradient is established in the process space for the components supplied. The concentration gradient leads to fluctuations in the layer thickness between individual semiconductor substrates of a batch or, in single-wafer installations, on the surface of the semiconductor substrate. If the main flow direction is then changed, a second concentration gradient is established, which differs from the first concentration gradient. The fluctuations that are observed within a batch between individual semiconductor substrates or, in single-wafer installations, on the surface of the wafer also change as a consequence. The changeover of the main flow direction is effected, if possible, such that the fluctuations in the properties of the deposited layer which are established between the individual semiconductor substrates of a batch in a multiwafer installation or on the surface of the semiconductor substrate in a single-wafer installation are largely compensated for.

Thus, by changing the main flow direction once or a number of times, it is possible to compensate for concentration gradients that are established for the components in the process space. As a result, it is also possible to avoid different layer thicknesses on semiconductor substrates of a batch, so that it is possible to achieve a significantly more uniform quality of the processed semiconductor substrates.

The method improves the uniformity of the treated semiconductor substrates, for example, with regard to the thickness of the deposited layer or a doping. It is not necessary to provide a temperature gradient in the process space. The temperature can be kept constant or can be varied uniformly in the entire process space. The semiconductor substrates of a batch therefore all experience the same thermal budget, i.e. they are heated to the same temperature for the same period of time. As a result, the reproducibility of the electronic properties of the microelectronic components produced is increased and the yield of functional circuits is increased.

An essential advantage of the method is the possibility of increasing the batch size further. The variable main flow direction significantly reduces the problem which concerns local concentration depletion and occurs particularly with relatively larger batch sizes. It is thus possible to use significantly larger batch sizes and thus to fabricate more components than hitherto within a production cycle. The economy of the method is significantly improved as a result.

The method is inherently independent of the size of the processed semiconductor substrates. Thus, wafers having a relatively large diameter, e.g. having a size of 300 mm or more, can also be processed without any problems. It goes without saying, however, that the method can also be used for processing smaller wafers.

Since concentration gradients in the process space are largely compensated for in the course of the method, it is sufficient if dopants for controlling the electronic properties of the semiconductor substrates are introduced into the process space as a process gas at only one location. Therefore, it is not necessary to provide lateral injection nozzles (injectors) along the main flow direction in the process space in order to compensate for a depletion of dopant in the process gas. The apparatuses suitable for carrying out the method can therefore be embodied in a structurally simple manner and are therefore insensitive to technical disturbances.

Of course, installations equipped with injectors may likewise be operated using the method, and use of the injectors can provide for an additional increase in the homogeneity.

The method thus improves the uniformity within a wafer batch. This relates both to the layer thickness and to the doping and the thermal budget. As a result, the reproducibility of the electronic properties of the electronic components fabricated from the semiconductor substrates is improved and, consequently, the yield of the circuits thereby fabricated is increased. This results in an increased yield of functional components and an associated increase in the productivity of the method.

In a preferred embodiment of the method, the main flow direction is reversed. A reversal of the main flow direction corresponds to a maximum change in the main flow direction. A maximum change in the flows within the furnace and thus an extensive compensation of concentration and temperature gradients take place in this case. As already described above, in multilayer installations, the semiconductor substrates are arranged in the process space in a manner stacked one above another at a short distance, and the process gas flows laterally past the stack forming a main flow direction. For this purpose, the process gas may be introduced into the process space e.g. at the underside. After a specific period of time, the main flow direction is reversed, i.e. the process gas is then introduced at the top side—opposite to the underside—of the process space. The main flow direction therefore changes by 180°. In single-wafer installations, the process gas flows parallel to the wafer surface. In this case, too, the main flow direction is reversed, that is to say rotated through 180°, after a specific period of time in order to compensate for concentration and temperature gradients. In single-wafer installations, it may be advantageous to change the main flow direction in smaller steps, e.g. by 90° in each case, in order to achieve an optimum compensation of the temperature and concentration gradients.

Therefore, it is advantageous if the main flow direction is oriented parallel to an axis of symmetry of the semiconductor substrates. In the event of a change in the main flow direction, concentration gradients are compensated for in a symmetrical manner along the axis of symmetry of the substrates. The homogeneity of the coated semiconductor substrates can then be significantly improved.

The axis of symmetry is preferably a rotation axis or a rotary mirror axis. These axes of symmetry have a particularly high degree of symmetry in comparison with other axes of symmetry, so that a particularly effective compensation of the concentration gradients is achieved when the main flow direction is oriented parallel to such an axis of symmetry. In multiwafer installations, the rotation axis runs perpendicular to the surface of the semiconductor substrate in the center of the stack. Therefore, as already described, the process gas flows laterally past the semiconductor stack along the main flow direction. In single-wafer installations, the rotary mirror axis runs along the wafer surface through the midpoint of the surface of the semiconductor substrate. The process gas therefore flows parallel to the wafer surface along the main flow direction across the semiconductor substrate.

In a preferred embodiment of the method, the process gas is at least partially removed from the process space before changing the main flow direction. The process gas introduced into the process space directly before changing the main flow direction no longer traverses the entire path through the process space, but rather experiences a flow reversal. If one takes a specific volume of the process gas flow which was introduced into the process space shortly before the flow reversal, the volume, up to the flow reversal, passes only as far as one of the lower semiconductor substrates of the stack in order then to be discharged from the process space in the opposite direction. The semiconductor substrates at the outer ends of the stack therefore experience an additionally intensified layer thickness growth. The effect may become apparent particularly when the main flow direction is changed repeatedly. Through skilful implementation of the method, this effect can be utilized to compensate for a reduced layer thickness growth at the ends of the wafer stack, caused by the low concentration of the components in the process gas, before this leaves the process space during the customary deposition. In order to avoid additional inhomogeneities, however, it is more favorable for process gas that is still present in the process space to be removed before the change in the main flow direction. As a result, fresh process gas can be introduced into the process space, which then flows through the process space over its entire extent. The desired concentration or temperature gradient then forms directly.

The removal of the process gas from the process space may be effected by reducing the supply of process gas into the process space and/or by extracting process gas from the process space and/or by flushing the process space with an inert gas (e.g. noble gas or nitrogen). In the case of the embodiment mentioned last, pressure surges in the reaction chamber are avoided.

The composition of the process gas supplied usually remains unchanged during the deposition of a layer or the introduction of a doping. It may be advantageous for specific requirements, however, if the components have a different composition and/or concentration after the change in the main flow direction. The flexibility of the method is thereby increased and it is possible, for example by using different dopant concentrations, to produce specific doping profiles in the semiconductor substrates and thereby to adapt electronic properties in a targeted manner.

Furthermore, by changing the composition of the process gas, it is possible, by way of example, also to realize layers including a plurality of different layers or particular defect structures, e.g. by changing the dopant.

According to one embodiment of the method, layers are fabricated, and the components contained in the process gas react chemically with the material of the semiconductor substrates. A chemical reaction between the components to be deposited and the semiconductor substrates liberates significantly higher quantities of energy than physical adsorption. The stability thereby achieved in the deposition layer produced is accordingly significantly higher, as a result of which service life and resistance to external influences such as mechanical and thermal loads or behavior toward moisture and chemicals can be optimized. Examples of such layers are layers made of silicon dioxide or silicon nitride. However, the method is also suitable for the fabrication of layers in which the components contained in the process gas all form the starting materials for the layer. In this case, the component may be deposited directly as the material of the layer (PVD; "Physical Vapor Deposition") or the material of the layer may be formed in a chemical reaction (CVD; "Chemical Vapor Deposition").

The vapor phase deposition can take place at atmospheric pressure, subatmospheric pressure, and in the near-vacuum or vacuum range, low pressure is preferred.

In a preferred embodiment of the method, the change in the main flow direction is effected in accordance with a variable time pattern. As a result, by way of example, it is possible to change the main flow direction with a higher frequency at the beginning of the vapor phase deposition in order first to obtain a starter layer that is as uniform as possible on all the semiconductor substrates. In a later stage of the method, when a constant deposition rate has been established for the individual semiconductor substrates, a lower frequency of the change in the main flow direction with longer interval ranges may then also be sufficient. In the case of depositions wherein the deposition rate remains essentially constant during the entire deposition, one change of direction is enough.

In a further embodiment of the method, an online detection of the quantity and/or the distribution of the components deposited onto the semiconductor substrates is effected during the method. As a result, the instantaneous deposition results with regard to the layer thickness and the quality are obtained directly. In the event of disturbances occurring or incomplete deposition, corresponding measures and corrections can be initiated immediately, so that it is possible to fabricate layers with high quality reproducibly.

An essential feature of the method is the change in the main flow direction in the process space. Therefore, specially configured furnaces are required to carry out the method. Therefore, the invention also relates to a furnace for the vapor phase deposition of components contained in a process gas onto one or more semiconductor substrates.

With the foregoing and other objects in view there is provided, in accordance with the invention, a furnace for vapor phase depositing components contained in a process gas onto at least one semiconductor substrate. The furnace includes: a process space for receiving the semiconductor substrate; a first feed/discharge line connected to the process space; a second feed/discharge line connected to the process space; a device for producing a process gas flow, the device for producing the process gas flow connected to the first feed/discharge line and/or the second feed/discharge line; a heating device; and a regulating unit for regulating a magnitude and a flow direction of the process gas flow.

This furnace makes it possible to achieve a homogeneous deposition of components on semiconductor substrates, so that a uniform coating of the semiconductor substrates with regard to layer thickness and layer quality is obtained even with extensive batch sizes. The furnace may be configured both as a single-wafer installation and as a multiwafer installation.

Since the electronic properties depend significantly on the material properties, the electronic quality of the microelectronic circuits produced from these semiconductor substrates is significantly improved. Therefore, the furnace makes it possible to fabricate microelectronic components with reduced dimensions.

The furnace differs from the furnaces used hitherto essentially by virtue of providing an apparatus that can vary or reverse the flow in the process space of the furnace. As already explained in connection with the method, a process gas containing the components to be deposited flows through the process space. The process gas is depleted because of the deposition of the components, so that a concentration gradient is established in the process space for the components along a main flow direction. If the flow conditions are varied by varying the flow direction, the concentration gradient is also varied. As a result of the superposition of the concentration gradients, it is possible in total to achieve a more uniform deposition of layers, in particular a uniform layer thickness within a batch.

First and second feed and discharge lines may inherently be configured in any desired manner. Thus, the first and second feed/discharge lines may be configured in each case as two lines opening into the process space. In each case, one of the lines acts as the feed line and the other as the discharge line. In this case, then, at least four lines open into the process space. However, feed and discharge lines may also be connected to the process space via a common access, so that only two lines open into the process space. It is also possible, however, for the feed and discharge lines to also be configured in the form of injectors as a plurality of feed and discharge lines in order, by way of example, to obtain a uniform flow of the process gas in the process space. In order to produce a flow in the process space, provision is correspondingly made of a device for producing a process gas flow, which is connected to the first and/or second feed/discharge line. Pumps are generally used for this, as are also customary in the furnaces used hitherto. The flow can be produced, for example, by forcing the process gas into the process space or by pumping the process gas out of the process space.

In order to achieve a flow reversal of the process gas, devices for regulating the magnitude and the flow direction of the process gas flow is provided. These may be valves, for example, for opening or closing the first and second feed/discharge lines. It is also possible, however, to influence the main flow direction using the device for producing a process gas flow, e.g. by correspondingly regulating the conveying capacity of a pump. The device for regulating the magnitude and the flow direction may be controlled in a computer-aided manner, for example.

Preferably, the first and second feed/discharge line are arranged at opposite sides of the process space. A reversal through 180° is then effected in the event of a change in the flow. This is particularly advantageous in multiwafer installations, since the concentration gradients are particularly pronounced here. First and second feed/discharge lines are advantageously provided at the underside and top side of the process space, that is to say in the lengthening of a boat that is arranged in the process space and is charged with wafers.

In accordance with a further embodiment, an interval regulating unit is provided, for changing the direction of the process gas flow at intervals according to a variable time pattern. As a result, in accordance with the course of the method, it is possible to realize suitable time windows for the individual deposition intervals. As already explained for the method, it may be advantageous at the beginning of a deposition cycle to provide a high frequency for the change in the main flow direction in order first to produce a thin starter layer uniformly on all the semiconductor substrates. This starter layer then acts as a seed layer for the subsequent deposition of the layer. Once a uniform layer growth has been initiated on the entire surface of the individual semiconductor substrates, it is also possible to use a lower frequency for changing the main flow direction. In this way, it is also possible to produce thicker layers with thicknesses of several micrometers, in which only slight fluctuations in the layer thickness within a batch are observed.

In order to be able to precisely control the growth of the layer, in accordance with a further embodiment of the furnace, there is provided, a measuring unit for detecting the quantity and/or distribution of the components deposited onto the semiconductor substrates. This measuring unit can be connected to the device for producing a process gas flow in order to control the process gas flow or the concentration of the components supplied.

In accordance with a preferred embodiment of the furnace, there is provided, a control unit connected to the measuring unit and serving for the online control of the device for producing a process gas flow. On the basis of the data determined by the measuring unit, it is then possible automatically to intervene in the deposition process and thus to influence the growth of the layer.

Other features which are considered as characteristic for the invention are set forth in the appended claims.

Although the invention is illustrated and described herein as embodied in a method and furnace for the vapor phase deposition of components onto semiconductor substrates with a variable main flow direction of the process gas, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
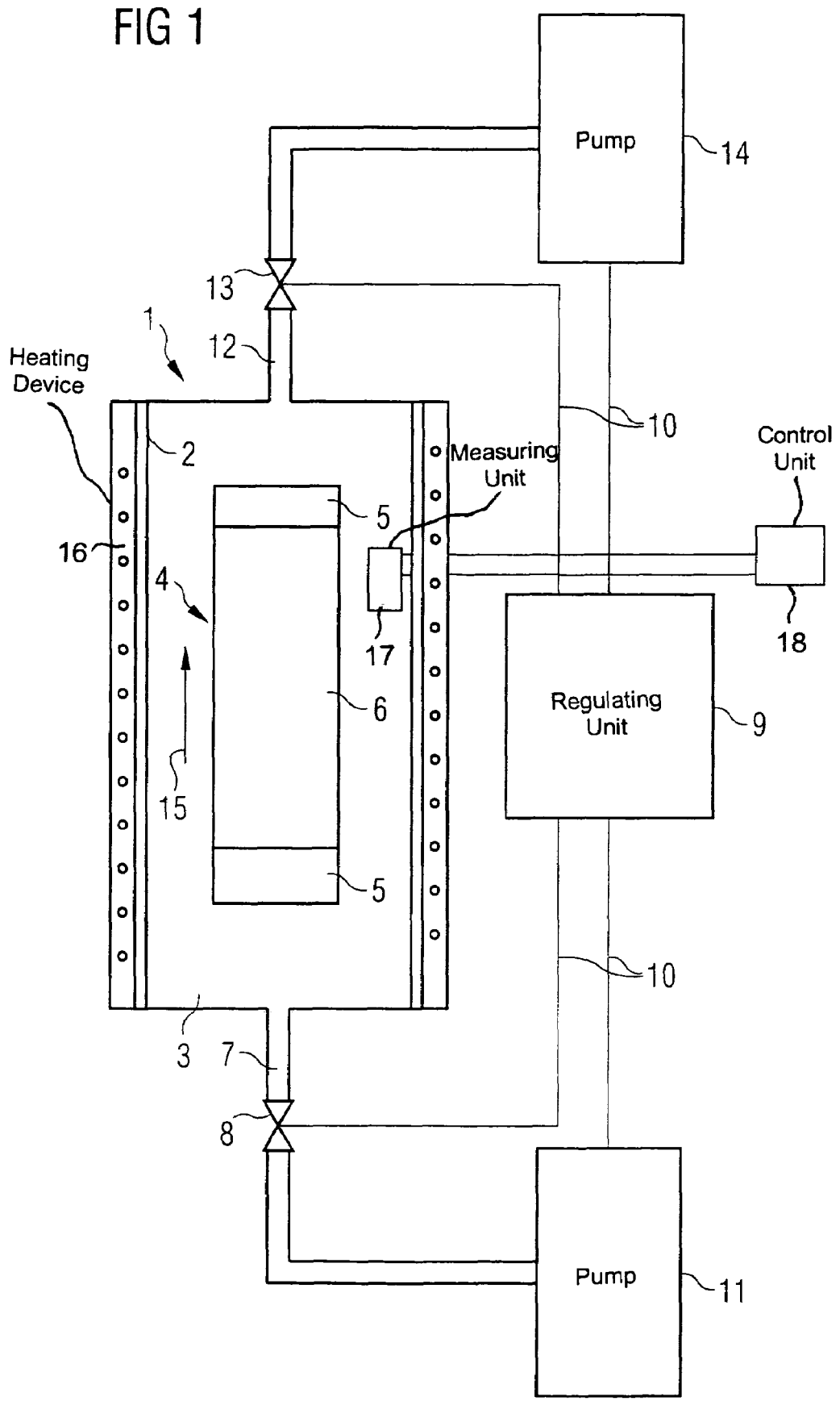
FIG. 1 is a diagrammatic illustration of a furnace.

Referring now to the figures of the drawing in detail and first, particularly, to FIG. 1 thereof, there is shown a diagrammatic illustration of a longitudinal section through a furnace 1. A process space 3 delimited by a partition 2 is arranged within the furnace 1. By way of example, a heating device 16 may be arranged behind the partition 2. Situated in the process space 3 is a boat 4, which includes a rack in which wafers are arranged one above the other at a short distance. For the sake of clarity, the rack and the wafers are not illustrated in detail. Dummy wafers 5 are arranged in the outer sections of the boat 4, that is to say at the top side and underside thereof, which dummy wafers 5 on both sides delimit the stack of the wafers 6 to be processed. The dummy wafers 5 serve for producing uniform flow conditions in the region of the wafers 6 to be processed. A first feed/discharge line 7 is provided at the underside of the process space 3, through which line 7 process gas can be supplied to the process space 3 and process gas can be conducted out of the process space 3. In order to be able to influence the flow of the process gas, a valve 8 is provided. The opening and closing of the valve 8 is controlled by a regulating unit 9, which is connected to the valve 8 via control lines 10.

Finally, a pump 11 is provided for producing a gas flow. The pump 11 can either convey process gas into the process space 3 or extract process gas from the latter, via the first feed/discharge line 7. The operating state of the pump 11 is likewise controlled by the regulating unit 9, which is connected to the pump 11 by corresponding control lines 10. A second feed/discharge line 12 is arranged at the side of the process space 3 that is opposite to the first feed/discharge line 7. The gas flow through the second feed/discharge line 12 can be regulated by valve 13, which is controlled by the regulating unit 9. The regulating unit 9 is connected to the valve 13 via control line 10. The pump 14 can supply process gas to the process space 3 or discharge process gas from the process space 3, via the second feed/discharge line 12.

When the inventive method is carried out, first the valve 8 is opened by the regulating unit 9 and process gas is conveyed into the process space 3 by the pump 11. Furthermore, valve 13 is opened and process gas is extracted from the process space 3 by the pump 14. The process gas flows through the first feed/discharge line 7 into the process space 3. The process gas rises laterally upward past the boat 4, and a main flow direction 15 is formed. From the process gas flow ascending along the main flow direction 15, portions diffuse away to the side into the interspaces between the wafers of the boat 4 that are arranged one above the other. In this case, the process gas flow is continuously depleted of the components that are deposited on the surface of the wafers, so that a concentration gradient is formed along the main flow direction 15. Finally, the process gas flow leaves the process space 3 through the second feed/discharge line 12 and is extracted using the pump 14. After a specific time period has elapsed, under the regulation of the regulating unit 9, the valves 8, 13 are closed and the pumps 11, 14 are stopped. The pumps 11, 14 are then switched such that the pump 14 conveys process gas into the process space 3, while the pump 11 extracts process gas from the process space 3. After the valves 8, 13 have been opened, the process gas then flows from above into the process space 3, so that the main flow direction 15 is reversed. As a consequence, a concentration gradient running in the opposite direction is formed, i.e. the greatest layer thickness growth is now observed at the upper end of the boat 4, where initially the least layer thickness growth took place. As a result, it is possible to compensate for differences in the layer thickness growth between individual wafers of the boat 4, so that within a batch, the fluctuations in the layer thickness can be considerably reduced.

A measuring unit 17 can detect a quantity and/or a distribution of the components deposited onto the semiconductor substrate 6. A control unit 18 is connected to the measuring unit 17. The control unit 18 is for an online control of the pumps 11, 14.

Figure 2D:
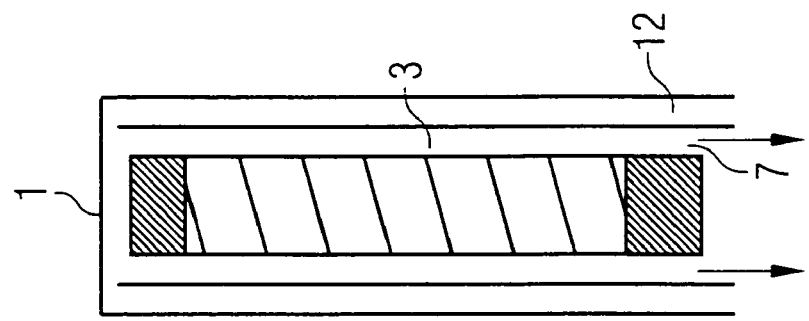
FIGS. 2A-2D are diagrammatic illustrations of a furnace.
Figure 2C:
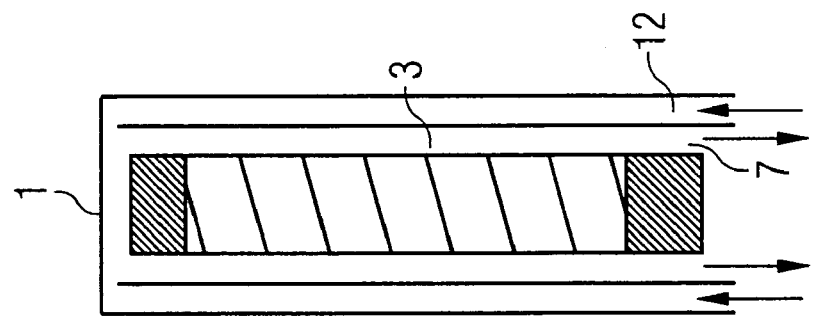
Figure 2B:
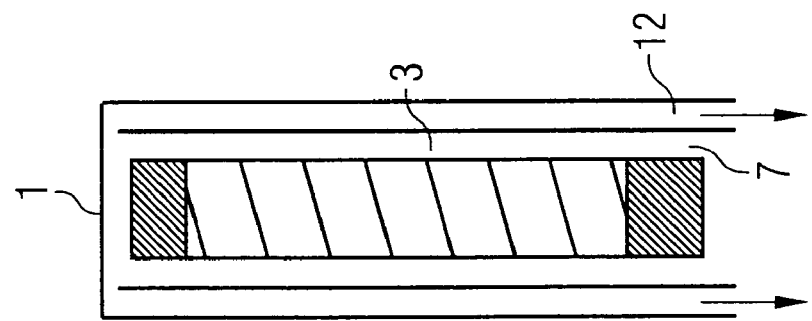
Figure 2A:
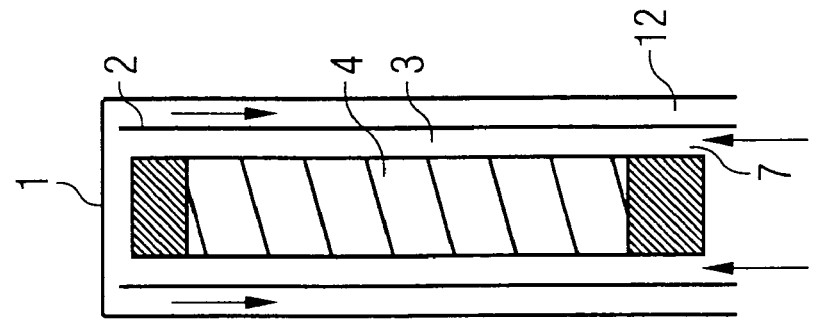

FIGS. 2A-2D diagrammatically show various steps performed in one embodiment of the inventive method. The arrangement of the first and second feed/discharge lines 7, 12 in the furnace 1 illustrated in FIGS. 2A-2D differs from that shown in the furnace 1 illustrated in FIG. 1. In the furnace 1 illustrated in FIGS. 2A-2D, the process gas flow is deflected at the upper end of a partition 2 and then guided downward laterally at the partition 2. As a result, the connections for the first and second feed/discharge lines 7, 12 can all be arranged at the underside of the furnace 1. The valves and the regulating unit for controlling the process gas flow are not illustrated for the sake of clarity. In the first method step, as illustrated in FIG. 2A, process gas is introduced into the process space 3 via the first feed/discharge line 7, rises upward past the boat 4 and is deflected at the upper end of the partition 2 in order then to be guided downward and finally led away via the second feed/discharge line 12. After a specific time period has elapsed, the supply of the process gas is interrupted while the process gas, as shown in FIG. 2B, continues to be pumped away from the process space 3 via the second feed/discharge line 12. Process gases still present in the process space 3 are therefore essentially removed. As an alternative, the process space 3 can also be flushed with an inert gas. Finally, as illustrated in FIG. 2C, the process gas is introduced into the process space 3 through the second feed/discharge line 12 and is discharged from the process space 3 through the first feed/discharge line 7, so that the main flow direction is reversed in the process space 3. After a specific time period has elapsed, the supply of the process gas is interrupted again while the process gas, as shown in FIG. 2D, continues to be extracted from the process space 3 via the first feed/discharge line 7. After spent process gases have been extracted again, as illustrated in FIG. 2D, the cycle illustrated in FIGS. 2A-D can be carried out again, if appropriate.

Figure 3:
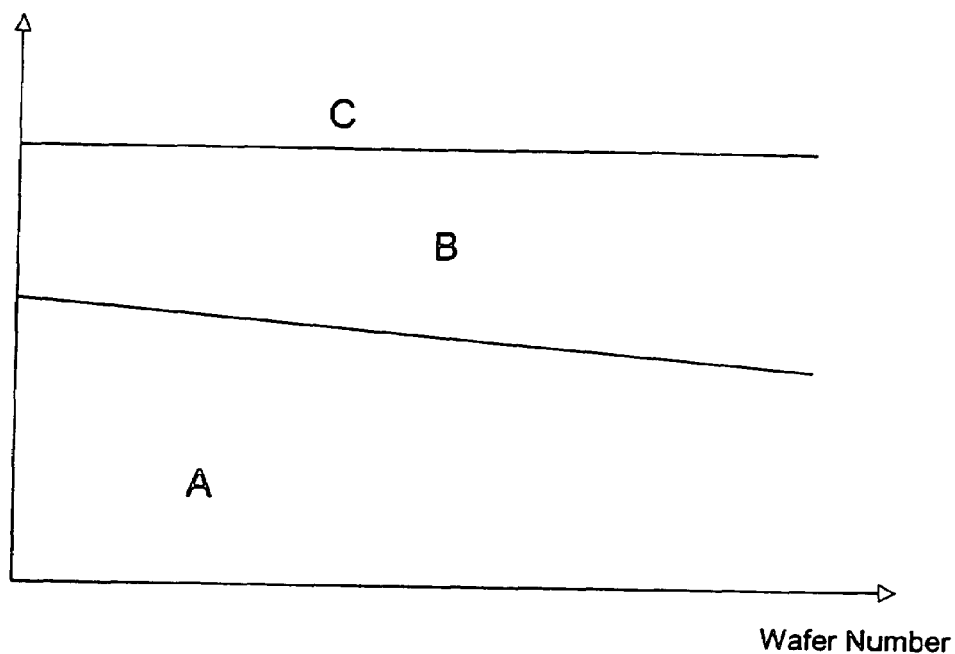
FIG. 3 is a graph of the layer thickness distribution in a batch obtained when carrying out the method.

FIG. 3 diagrammatically shows the distribution of the layer thickness produced during the individual process stages of the method. In this case, the ordinal number of the wafer 6 within the stack is specified on the X axis. The wafer 1 is arranged at the lower end in FIG. 1, while the wafers with higher numbers are arranged correspondingly further up in the boat 4. The layer thickness growth is specified on the Y axis. If the process gas is introduced into the process space 3 through the first feed/discharge line 7 and passed out of the process space through the second feed/discharge line 12, then a higher layer thickness growth takes place on wafers with a low ordinal number than on wafers with a high ordinal number since the former are arranged nearer to the first feed/discharge line 7, and the process gas flow has a high concentration of the component to be deposited. If the layer thickness growth is measured, then region "A" illustrated in FIG. 3 is obtained. After reversing the flow direction, the process gas then flows into the process space through the second feed/discharge line 12 and is passed out again via the first feed/discharge line 7. The wafers with a high ordinal number then correspondingly experience a more pronounced layer thickness growth than the wafers with a low ordinal number. If the layer thickness growth is measured, region "B" illustrated in FIG. 3 is correspondingly obtained. Since the two regions "A" and "B" are ultimately added, curve "C" is obtained after carrying out the method.

Figure 4:
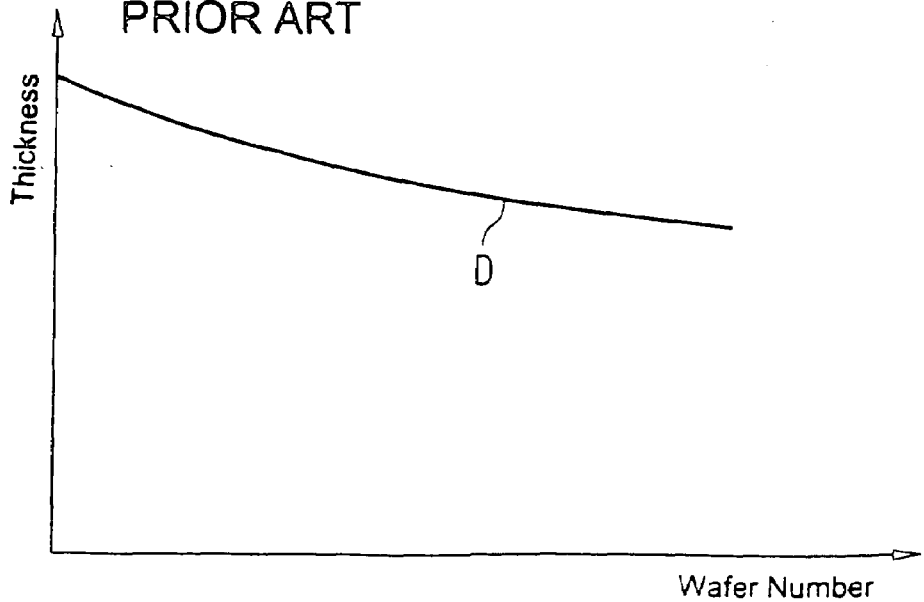
FIG. 4 is a graph of the layer thickness distribution in a batch obtained when carrying out a prior art method.

FIG. 4 shows the distribution of the layer thickness when carrying out a prior art method for depositing a layer on a wafer. The same apparatus as illustrated in FIG. 1 is used, but the main flow direction is not varied. Therefore, during the entire deposition, the process gas is introduced into the process space 3 at the feed line 7 and, after it has flowed through the process space 3 along a main flow direction 15, the process gas is discharged from the process space 3 at the discharge line 12. As described above, a concentration gradient is established along the main flow direction 15 and leads to a different layer thickness growth on the wafers 6 arranged in the process space 3. Wafers 6 that are arranged nearer to the feed line 7 experience a higher layer thickness growth than wafers 6 that are arranged nearer to the discharge line 12. The distribution of the layer thickness is illustrated in FIG. 4. In this case, as in FIG. 3, the wafer number is plotted on the abscissa and the layer thickness is plotted on the ordinate. A curve "D" is obtained, which essentially corresponds to the curve A from FIG. 3. If the layer thicknesses of the wafers 6 are compared after the end of the layer deposition, curve "C" from FIG. 3 exhibits significantly smaller deviations in the layer thickness in comparison with curve "D" shown in FIG. 4.

I claim:

1. A method for vapor phase deposition, which comprises:
providing a process space having a top side and a bottom side;
vapor phase depositing components contained in a process gas flowing along a main flow direction between the sides of the process space laterally past and onto a plurality of semiconductor substrates disposed one above another at a short distance to form a stack in the process space;
during the step of vapor phase depositing, changing the main flow direction by 180° at least once while continuing flowing laterally past the stack; and
detecting a quantity and/or a distribution of the components deposited onto the semiconductor substrates with a measuring unit.

2. The method according to claim 1, wherein the step of changing the main flow direction is performed by reversing the main flow direction.

3. The method according to claim 1, which further comprises: orienting the main flow direction parallel to an axis of symmetry of a plurality of semiconductor substrates in the process space.

4. The method according to claim 3, wherein the axis of symmetry is a rotation axis or a rotary mirror axis.

5. The method according to claim 1, which further comprises: at least partially removing the process gas from the process space before performing the step of changing the main flow direction.

6. The method according to claim 5, wherein the step of at least partially removing the process gas is achieved by performing at least one step selected from a group consisting of reducing a supply of the process gas into the process space, extracting the process gas from the process space, and flushing the process space with an inert gas.

7. The method according to claim 1, which further comprises: after performing the step of changing the main flow direction, providing the components with a different composition and/or a different concentration in relation to before performing the step of changing the main flow direction.

8. The method according to claim 1, wherein the components react chemically with the semiconductor substrate.

9. The method according to claim 1, which further comprises: performing the step of vapor phase depositing below atmospheric pressure.

10. The method according to claim 1, wherein the step of changing the main flow direction is performed in accordance with a variable time pattern.

11. The method according to claim 1, which further comprises: while performing the step of vapor phase depositing, detecting a quantity and/or a distribution of the components being deposited onto the semiconductor substrate.

12. The method according to claim 1, which further comprises: while performing the step of vapor phase depositing, detecting a quantity and/or a distribution of the components being deposited onto the semiconductor substrate while online.

13. The method according to claim 1, which further comprises guiding the process gas in the main flow direction without guides or obstructions in the process space.

14. The method according to claim 1, wherein the main flow direction of the process gas within the process space is unidirectional.

15. The method according to claim 1, which further comprises passing the same process gas through the process space before and after the step of changing the main flow direction.

16. A furnace for vapor phase depositing components contained in a process gas onto a plurality of semiconductor substrates, the furnace comprising:
a process space for receiving the semiconductor substrates disposed one above another at a short distance to form a stack, said process space having a top side and a bottom side;
a first feed/discharge line connected to said process space at said bottom side;
a second feed/discharge line connected to said process space at said top side;
a device for producing a process gas flow, said device for producing said process gas flow connected to said first feed/discharge line and/or said second feed/discharge line causing the process gas to flow laterally past the stack defining a main flow direction;
a heating device;
a regulating unit for regulating amagnitude of said process gas flow and for changing the main flow direction by 180° while continuing to flow laterally past the stack; and
a measuring unit for detecting a quantity and/or a distribution of the components deposited onto the semiconductor substrates.

17. The furnace according to claim 16 wherein said regulating unit is configured for changing the main flow direction of said process gas flow at intervals in accordance with a variable time pattern.

18. The furnace according to claim 16, further comprising: a control unit connected to said measuring unit, said control unit for an online control of said device for producing a process gas flow.

19. The furnace according to claim 16, wherein said process gas flow is unobstructed in said process space.

20. The furnace according to claim 16, wherein said process space has no obstructions or guides therein for said process gas flow.

21. The furnace according to claim 16, wherein said regulating unit causes said main flow direction of said process gas flow to be unidirectional within said process space.

22. A method for vapor phase deposition, which comprises:
vapor phase depositing components contained in a process gas flowing along a main flow direction laterally past and onto a plurality of semiconductor substrates disposed one above another at a short distance to form a stack in a process space;
during the step of vapor phase depositing, changing the main flow direction by 180° at least once while continuing flowing laterally past the stack;
passing the same process gas through the process space before and after the step of changing the main flow direction; and
detecting a quantity and/or a distribution of the components deposited onto the semiconductor substrates with a measuring unit.

* * * * *